United States Patent [19]

Sugihara

[11] Patent Number: 5,493,296
[45] Date of Patent: Feb. 20, 1996

[54] NOISE SHAPING CIRCUIT AND NOISE SHAPING METHOD

[75] Inventor: Tohru Sugihara, Kanagawa, Japan

[73] Assignee: Sony Corporation, Tokyo, Japan

[21] Appl. No.: 432,901

[22] Filed: May 2, 1995

Related U.S. Application Data

[63] Continuation of Ser. No. 142,859, Oct. 28, 1993, abandoned.

[30] Foreign Application Priority Data

Oct. 31, 1992 [JP] Japan .................................. 4-316520

[51] Int. Cl.$^6$ ................................................. H03M 3/00
[52] U.S. Cl. ........................... 341/76; 341/200; 395/2.24; 395/2.35; 395/2.39
[58] Field of Search ............................. 341/76, 77, 143, 341/200; 395/2.19, 2.21, 2.24, 2.35, 2.39

[56] References Cited

U.S. PATENT DOCUMENTS

| | | | |
|---|---|---|---|
| 4,622,537 | 11/1986 | Aiko | 341/76 |
| 4,937,576 | 6/1990 | Yoshio et al. | 341/131 |
| 5,204,677 | 4/1993 | Akagiri et al. | 341/118 |
| 5,252,973 | 10/1993 | Masuda | 341/131 |

OTHER PUBLICATIONS

Patent Abstracts of Japan, vol. 16, No. 364, Aug. 6, 1992 corres. to Japanese Appln. JP-4115722.

*Primary Examiner*—Howard L. Williams
*Attorney, Agent, or Firm*—Jay H. Maioli

[57] ABSTRACT

A noise shaping circuit and a noise shaping method, in which a quantization error generated in a requantizer is taken out at a subtractive node and fed back to an input of the requantizer via a noise filter. A dc detector detects if the input signal from an input terminal is of a dc value including zero. If the input signal is detected to be a dc signal, the feedback quantity is reset to zero to prevent the oscillation by the limit cycle and to prevent the hunting phenomenon from occurring.

17 Claims, 8 Drawing Sheets

5,493,296

NOISE SHAPING CIRCUIT AND NOISE SHAPING METHOD

This is a continuation of application Ser. No. 08/142,859 filed Oct. 28, 1993, now abandoned.

BACKGROUND OF THE INVENTION

This invention relates to a noise shaping circuit and a noise shaping method for feeding the quantization noise generated by a quantizer via a noise filter back to an input side of the quantizer.

In general, in a noise shaping circuit, the quantization noise generated by the quantizer is fed back via the noise filter to the input side of the quantizer for changing the frequency characteristics of the quantization noise. The noise shaping circuit may be thought of as belonging to a digital filter having a feedback loop.

Such noise shaping circuit may be occasionally utilized for improving the sound quality of the sound recorded with 16 bits to the level as if the source was recorded with e.g. 20 or 24 bits, without changing the format for the compact disc (CD) or the digital audio recorder (DAT) providing that the number of bits of sample data equal to 16 as disclosed for example in U.S. Pat. No. 5204677.

That is, in converting source signals recorded with 20 or 24 bits into 16-bit signals, the frequency characteristics of the quantization noise are modified by way of noise shaping for approximating the frequency characteristics of the quantization noise to the loudness equalization curves, in order to take account of auditory characteristics of human ears, above all, equal loudness curve characteristics, for reproducing the music with the rich and ambient feeling having reduced harmonic distortions and improved input/output linearity.

Meanwhile, with the above-described digital filter in the feedback loop, it occurs frequently that oscillation is produced due to the so-called limit cycle even although the input signal becomes zero or is of a constant value, such as a dc value. That is, when the input signal should be a dc value, the data left in the filter continues to be oscillate to output oscillation data by way of hunting. If such hunting is produced, an output value may be replaced by a substitute value or the output may be decreased on detection of the hunting. In such case, it is necessary to provide an additional operating step. On the other hand, an output other than a zero output occasionally cannot be obtained for an input dc value.

Also, in the noise shaping circuit in which the quantization noise is fed back via a noise filter to an input side of the quantizer, oscillation data due to hunting tends to be added to the input data even though the number of bits of the input data is equal to or less than the number of bits of the output data.

SUMMARY OF THE INVENTION

In view of the above-described status of the art, it is an object of the present invention to provide a noise shaping circuit of a simplified construction in which the hunting may be prevented from its occurrence even when there is the risk of occurrence of the hunting as when the input signal is of a dc value including zero or when the number of bits of the input signals is the same as or less than the number of bits of the output signals.

According to the present invention, there is provided a noise shaping circuit in which the quantization noise generated by a quantizer is fed back via a noise filter to an input side of the quantizer which noise shaping circuit comprises means for detecting that the input signal is of a dc value including zero, a signal value fed back to the quantizer being set to zero when a dc input is detected by the detecting means.

If the dc input is detected by the dc detecting means, it suffices to set the coefficients of the noise filter to zero in their entirety. On the other hand, if suffices to construct the dc detecting means so as to detect that a pre-set number of consecutive samples of the input signal is of a constant value.

Detecting means may be provided for detecting that the number of bits of the input signals is less than the number of bits of the output signal. The signal value fed back to the quantizer is set to zero when the detection means detect that the number of bits of the input signal is less than that of the output signal.

In such case, the coefficients of the noise filter may be set to zero when the number of input bits i s found by the bit number detection means to be less than that of the output bits.

According to the present invention, there is also provided a noise shaping circuit in which the quantization noise generated by a quantizer is fed back via a noise filter to an input side of the quantizer, wherein detection means is provided for detecting that lower order bits of a pre-set number of consecutive input samples remain constant, that is have the same value, and wherein, when the lower order bits are found to be of the same value, the feedback quantity is reset to zero.

With the above-described arrangements of the present invention, if the input signal is of the same dc value inclusive of zero or the number of bits of the input signal becomes equal to or less than the number of bits of the output signal so that hunting is likely to be produced, such status may be detected so that the signal value fed back to the quantizer will be set to zero to prevent the hunting from occurring.

By detecting that the lower order bits of a pre-set number of consecutive input samples remain at the same value, it becomes possible to detect whether or not the input signal is of a dc value including Zero and simultaneously to detect whether the number of input bits is not more than the number of output quantization bits, thereby simplifying the structure.

DESCRIPTION OF THE PREFERRED EMBODIMENTS

Figure 1:
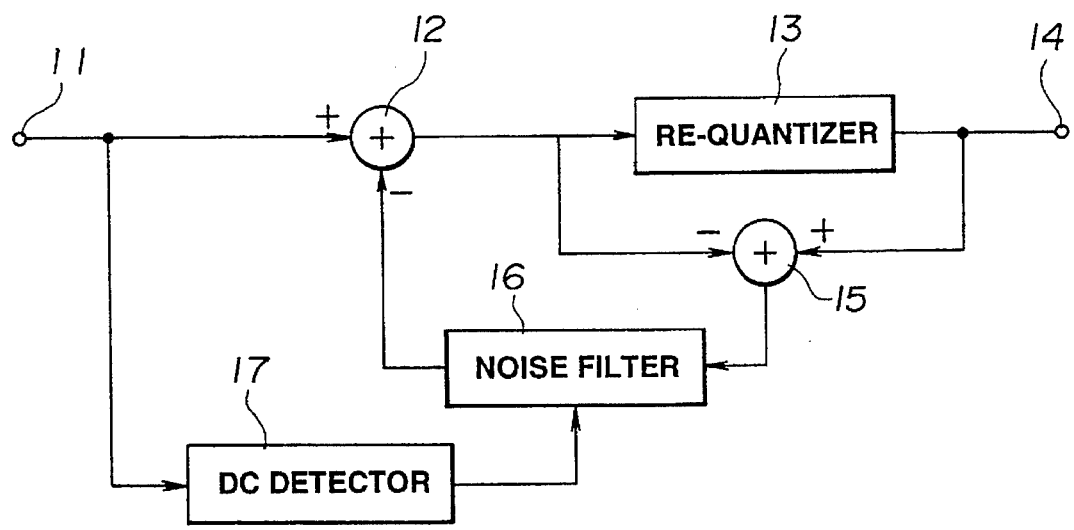
FIG. 1 is a block circuit diagram for illustrating an embodiment of a noise shaping circuit according to the present invention.

FIG. 1 shows, in a block circuit diagram, a schematic arrangement of a noise shaping circuit embodying the present invention.

Referring to FIG. 1, n-bit input digital signals, n being an integer, supplied to an input terminal 11, are transmitted via an additive node (subtractive node) 12 to a requantizer 13. In the requantizer 3, the n-bit data are re-quantized into, for example, m-bit data, so that the m-bit digital signals are outputted at an output terminal 14, m being also an integer (n <m). The subtractive node 15 calculates a difference between an output and an input of the requantizer 15 (quantization error on noise) which is transmitted to a noise filter 16. An output of the noise filter 16 is supplied to the subtractive node 12 so as to be fed back to the input signal. If the input to the requantizer 13 is subtracted from the output thereof, the output of the noise filter 16 is subtracted from its input signal.

Meanwhile, should the input signal assume a dc value, including zero, it is necessary for the output value to be equal to the same dc value as that assumed by the input value. However, due to the limit cycle, small amounts of the signal are left and repeatedly fed back to the node 12, depending on the internal state of the filter 16. The result is the so-called hunting phenomenon in which, even although the input is zero, the state of oscillation is incurred to output a sound due to oscillation. In order to prevent this from occurring, if the input data is liable to incur the hunting phenomenon, that is the dc value including zero, the feedback quantity from the noise filter 16 to the additive node (subtractive node) 12 at the input to the requantizer 13 is set so as to be equal to zero.

That is, in the embodiment shown in FIG. 1, the input signal from the input terminal 11 is supplied to a dc detector 17 for detecting whether or not the input signal is a dc signal inclusive of a zero signal. If the input signal is a dc signal, inclusive of zero, the coefficient values of the noise filter 16 are changed over in their entirety to zero under a control signal from the dc detector 17, so that the feedback quantity from the noise filter 16 to the additive node (subtractive node) 12 is reduced to zero. If the noise fed back to the requantizer 13 is zero, the n-bit input signal from the input terminal 11 is simply converted into the m-bit signals which are outputted at the output terminal 14 for preventing the hunting phenomenon from its occurrence.

Figure 2:
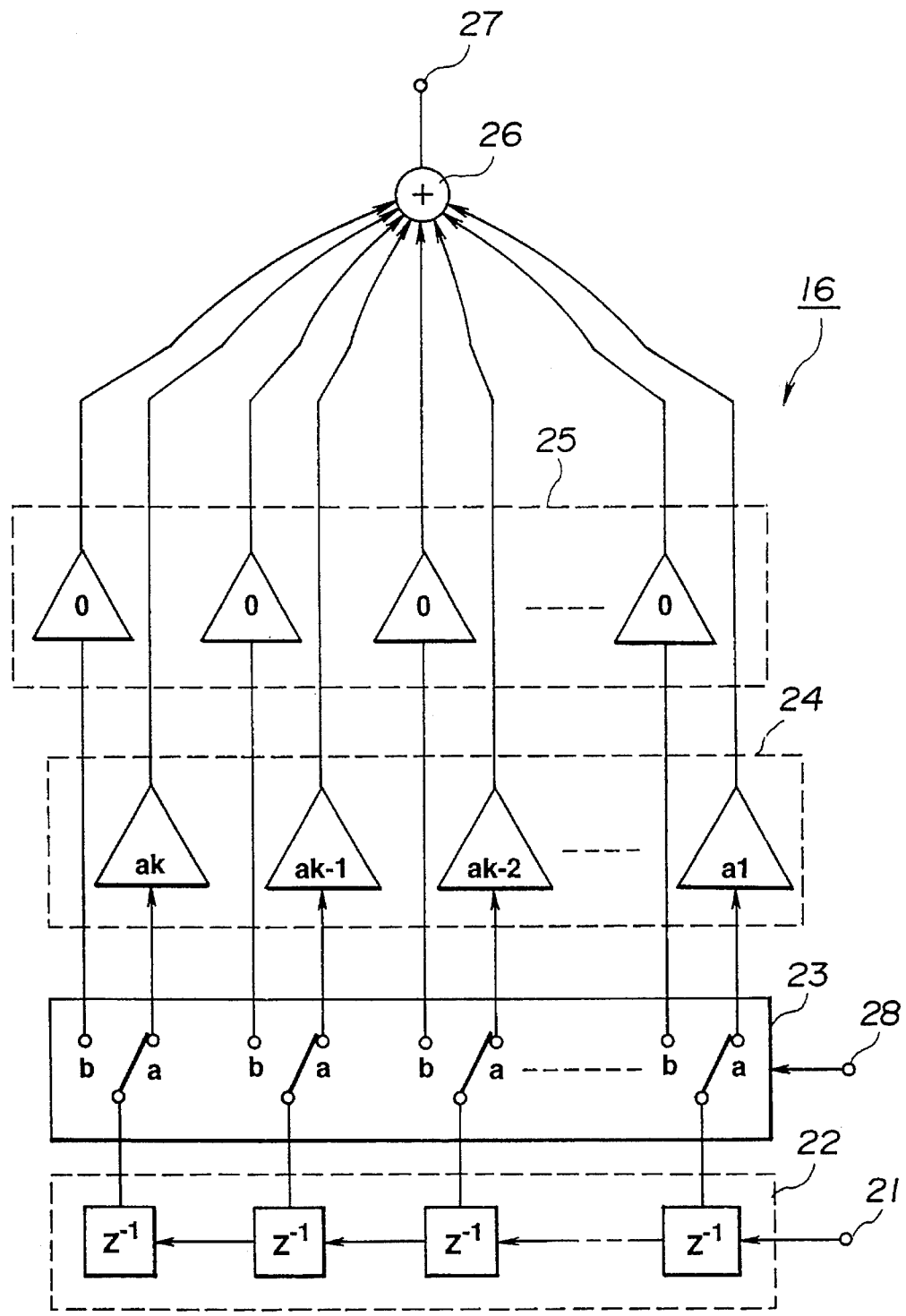
FIG. 2 is a block diagram for illustrating a concrete arrangement of a noise filter employed in the embodiment of FIG. 1.

FIG. 2 shows, by a block circuit diagram, a concrete example of the internal construction of the noise filter 16.

Referring to FIG. 2, the quantization errors (quantization noise) from the subtractive node 15 are supplied to an input terminal 21 and thence to a group of delay devices 22 made up of a plurality of, e.g. k, series connected delay devices. Delayed outputs of the delay devices of the group of the delay devices 22 are supplied to the same fixed terminals a of a plurality of e.g. k changeover switches of the group making up a changeover switches 23. Outputs of the fixed terminals a of the group of the changeover switches 23 are supplied to e.g. k coefficient multipliers making up a group of the coefficient multipliers 24 and thereby multiplied by coefficients $a_1, \ldots a_{k-1}, a_k$ before being outputted to an addition unit 26. Outputs of the other fixed terminals b of the changeover switches of the group of the changeover switches 23 are supplied to e.g. k coefficient multipliers of a group of coefficient multipliers 25 and thereby multiplied by a coefficient 0 before being supplied to the addition unit 26. An output of the addition unit 26 is taken out at an output terminal 27 before being supplied to the additive node (subtractive node) 12 at the input to the requantizer 13. The changeover switches of the group of the changeover switches 23 are changed over under control of a dc detection signal from the dc detector 17 which is supplied at a changeover control signal input terminal 28.

Thus, when the dc value including zero is not detected by the dc detector 17, the changeover switches of the group of the changeover switches 23 of the noise filter 16 are set to the fixed terminals a so that feedback signals for usual noise shaping by the filter coefficients $a_1, \ldots a_{k-1}, a_k$ of the coefficient multipliers of the group of the coefficient multipliers 24 are outputted at the output terminal 27. On the other hand, when the dc value including zero is detected by the dc detector 17, the changeover switches of the group of the changeover switches 23 are set to the fixed terminals b so that the delayed outputs are multiplied by the coefficient 0 of the group of the coefficient multipliers 25. Thus the output at the output terminal 27 is equal to zero, with the feedback quantity to the requantizer 13 being zero.

Although the noise shaping circuit shown in FIG. 1 or the noise filter shown in FIG. 2 may be realized by hardware, they are preferably arranged by the software technique using a so-called digital signal processor (DSP).

Figure 3:
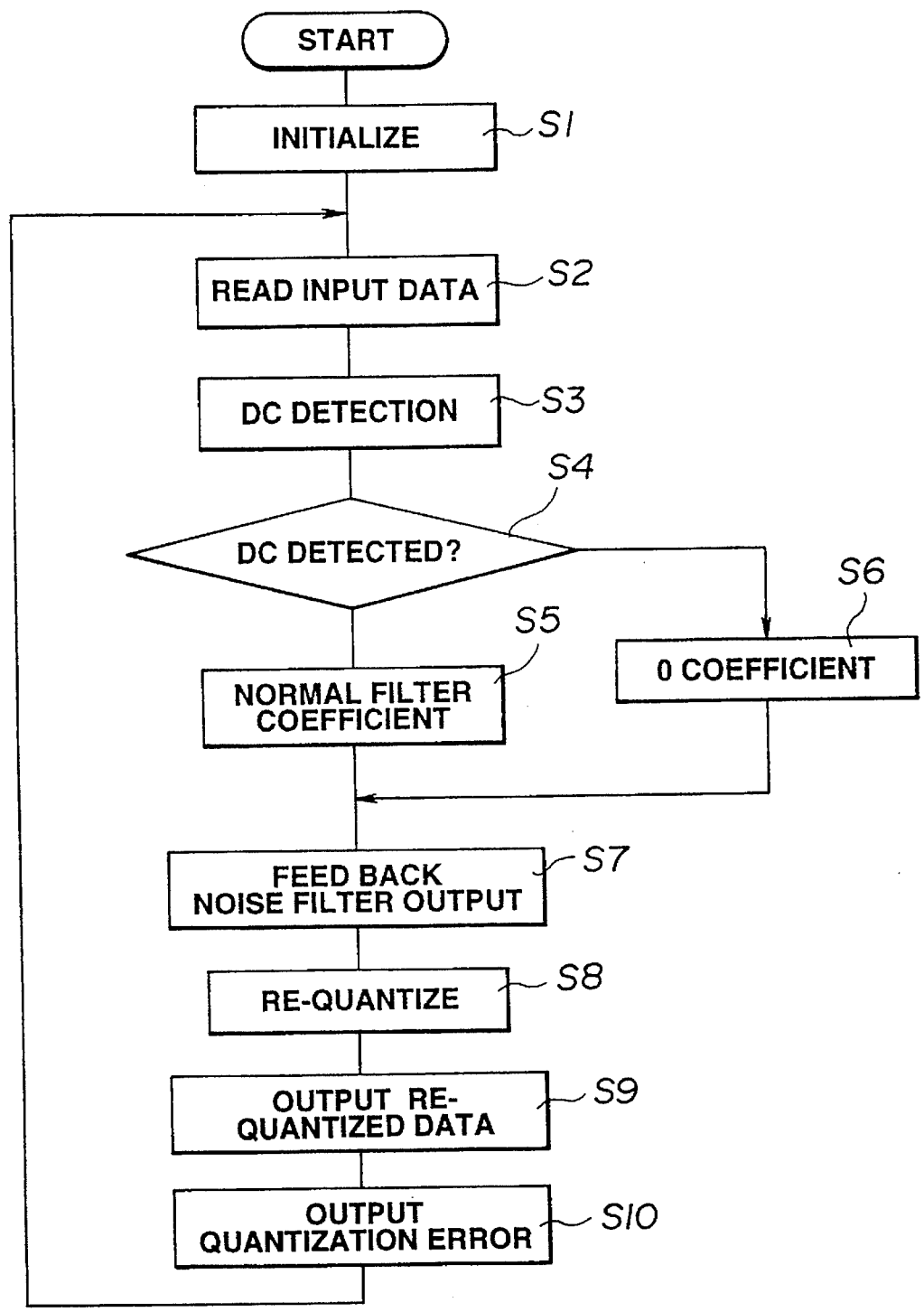
FIG. 3 is a flow chart for illustrating the operation of essential parts of the embodiment shown in FIG. 1.

In FIG. 3, there is shown a flow chart showing concrete examples of the essential operations to be carried out when the construction of the noise shaping circuit shown in FIG. 1 is to be implemented by the software technique using the DSP.

Referring to FIG. 3, after the initializing first step S1, input signal data from the input terminal 11 are read at the next step S2. The operation of dc detection, inclusive of zero detection, is performed on the input data at step S3 for making a decision as to if the dc value has been detected. Specifically, a plurality of samples of the input data are monitored and, if more than a predetermined number of input samples are of the same value, the input data is assumed to be a dc data, and a dc detection flag is set, so that dc detection is made depending on whether or not such dc detection flag has been set. If the result at step S4 is NO, that is, if it is found at step S4 that the value has not been detected, control proceeds to step S5 to cause the noise filter calculations to be made using the filter coefficients for the normal filter operation, that is the filter coefficients $a_1, \ldots a_{k-1}, a_k$ of the group of the coefficient multipliers 24 shown in FIG. 2. Conversely, if the result at step S4 is YES, that is, if it is found at step S5 that the dc value has been detected, control proceeds to step S6 to cause the noise filter calculations to be made using the Zero filter coefficient of the group of the coefficient multipliers 25.

At the next step S7, the noise filter output as found by the step S5 OF step S6 is fed back to the input of the requantizer 13. The operation corresponds to the taking of the sum or the difference between the noise filter Output and the input data at the additive node (subtractive node) 12 shown in FIG. 1. At the next step S8, the n-bit data are re-quantized into m-bit data by way of re-quantization, and the Fe-quantized data is outputted at the next step S9. At the next step S10, a difference between the re-quantized output and the input for re-quantization is calculated to find a quantization error (quantization noise) which is used as an input value for noise filter calculation. After the end of the above-mentioned sequence of operations, control reverts to the reading of the input data at step S2.

Meanwhile, the above-described noise shaping circuit may be applied to a system for improving the quality of reproduced audio signals within the range of pre-set limitations as to the number of bits of sample data in the digital audio signal format. Among the techniques for improving the sound quality, there is a technique known as super bit mapping (SBM) proposed by the present Applicant. With such sound quality improvement system, the sound quality close to the sound quality of a source recorded with e.g. 20 of 24 bits may be achieved without modifying the format for compact disc (CD) or digital audio tape recorder (DAT) in which the number of sample data is pre-set to 16 bits.

Figure 4:
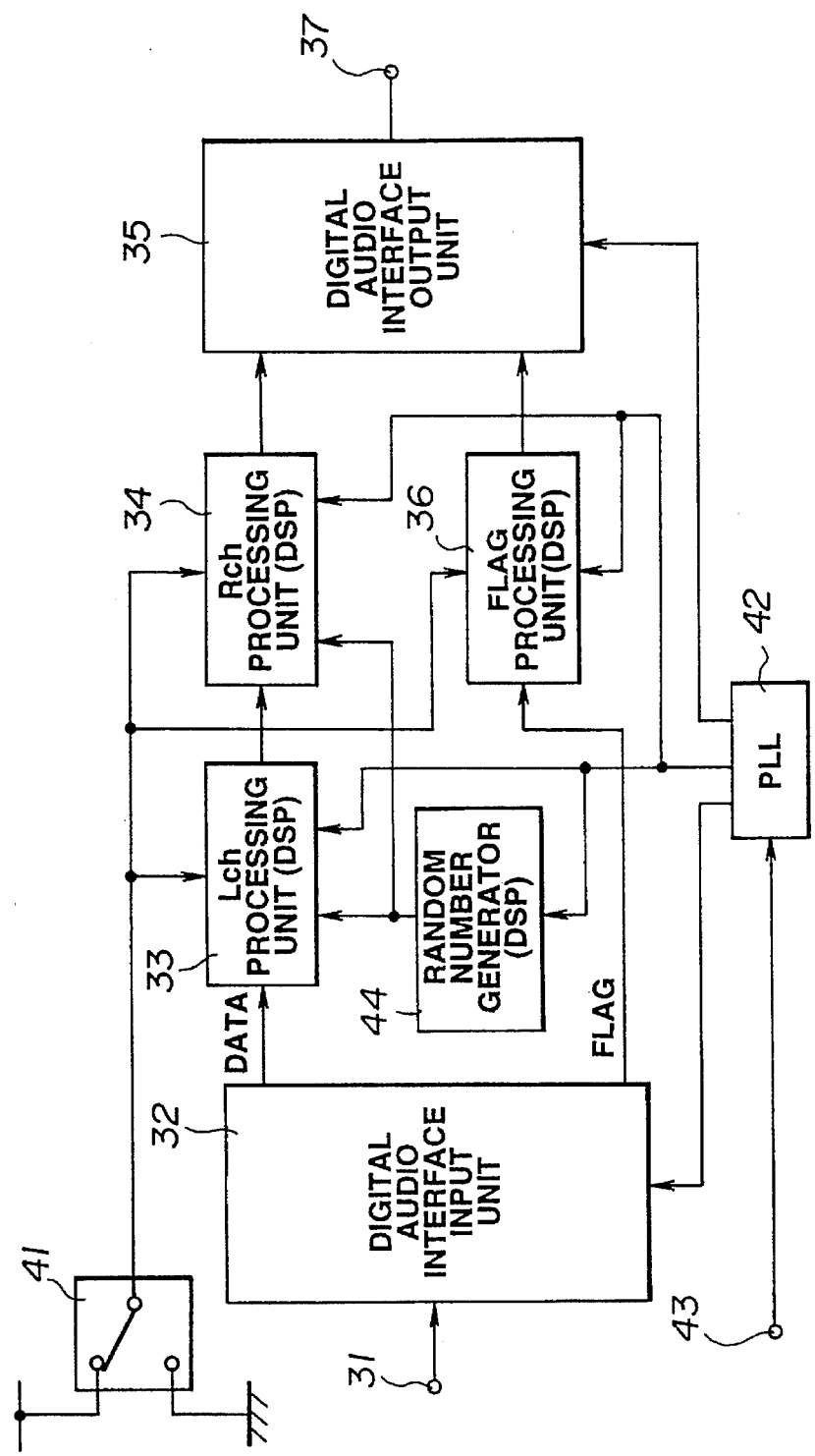
FIG. 4 is a block circuit diagram showing a processing unit for sound quality improvement employing the noise shaping circuit of the embodiment shown in FIG. 1.

FIG. 4 shows a concrete example of a sound quality improvement system for which the noise shaping circuit according to the present invention may be employed. With the sound quality improvement system, the distribution of the quantization noise incurred by re-quantization from 20-bit audio data to e.g. 16-bit audio data is changed in accordance with the auditory characteristics of human ears using the noise shaping for decreasing the noise in the frequency domain to which the human aural sense is more sensitive and for extending the linear region for minimizing the deterioration in the sound quality incurred on converting the 20-bit audio data into the 16-bit audio data, by taking advantage of auditory characteristics of the human ears that the human aural sense is changed in sensitivity depending on the sound frequency as represented by equal loudness curves.

In FIG. 4, 20-bit audio data, for example, which is based on a prescribed interfacing standard, such as the AES/EBU standard, is entered along with flags to a digital audio interfacing input unit 32 via an input terminal 31. The input digital signals are separated at the digital audio interfacing input unit 32 into a data part and the flags. The data part is transferred to a left channel (Lch) processing unit 33 having the above-described noise-shaping configuration. The Lch processing unit 33 performs the above-described noise shaping on the Lch (left channel) data of the input signals, whereby the quantization noise is modified at the time of re-quantization from the 20-bit data into the 16-bit data so that the frequency characteristics of the quantization noise is close to that represented by the equal loudness curves. On the other hand, Rch(right channel) data is transmitted as the 20-bit data to a downstream side Rch (right channel) processing unit 34. The Rch processing unit 34 performs a similar noise shaping operation on the 20-bit Rch data.

The 16-bit Lch and Rch data, thus processed with noise shaping by the Lch processing unit 33 and Rch processing unit 34, are transferred to a digital audio interfacing output unit 35.

The flags from the digital audio interfacing input unit 32 are transmitted to a flag processing unit 36 and thereby processed with a flag-converting operation accompanying the flag conversion. The flags thus converted are transferred to the digital audio interfacing output unit 35.

The data part and the flags, thus transferred to the digital audio interfacing output unit 35, are processed into digital signals having the format pursuant to prescribed interfacing standards, such as the AES/EBU standard, so as to be outputted at an output terminal 37.

A mode changeover switch 41 is employed for making a selection a to whether the input signal is to be processed for improving the sound quality as described above or to be outputted directly without such processing. A changeover information signal from the mode changeover switch 41 is transmitted to the Lch processing unit 33, Rch processing unit 34 and to the flag processing unit 36 for changing over the processing contents of the units in accordance with the software technique. A PLL unit 42 generates clocks for operating the device in synchronism with input synchronizing clock signals supplied to an input terminal 43 or with synchronizing clock signals extracted and supplied to the input terminal 43, and distributes the generated clocks to the processing units. A random number generator 44 generates random number data employed for calculations by the filter transmits the generated data to the Lch processing unit 33 and to the Rch processing unit 34.

Figure 5:
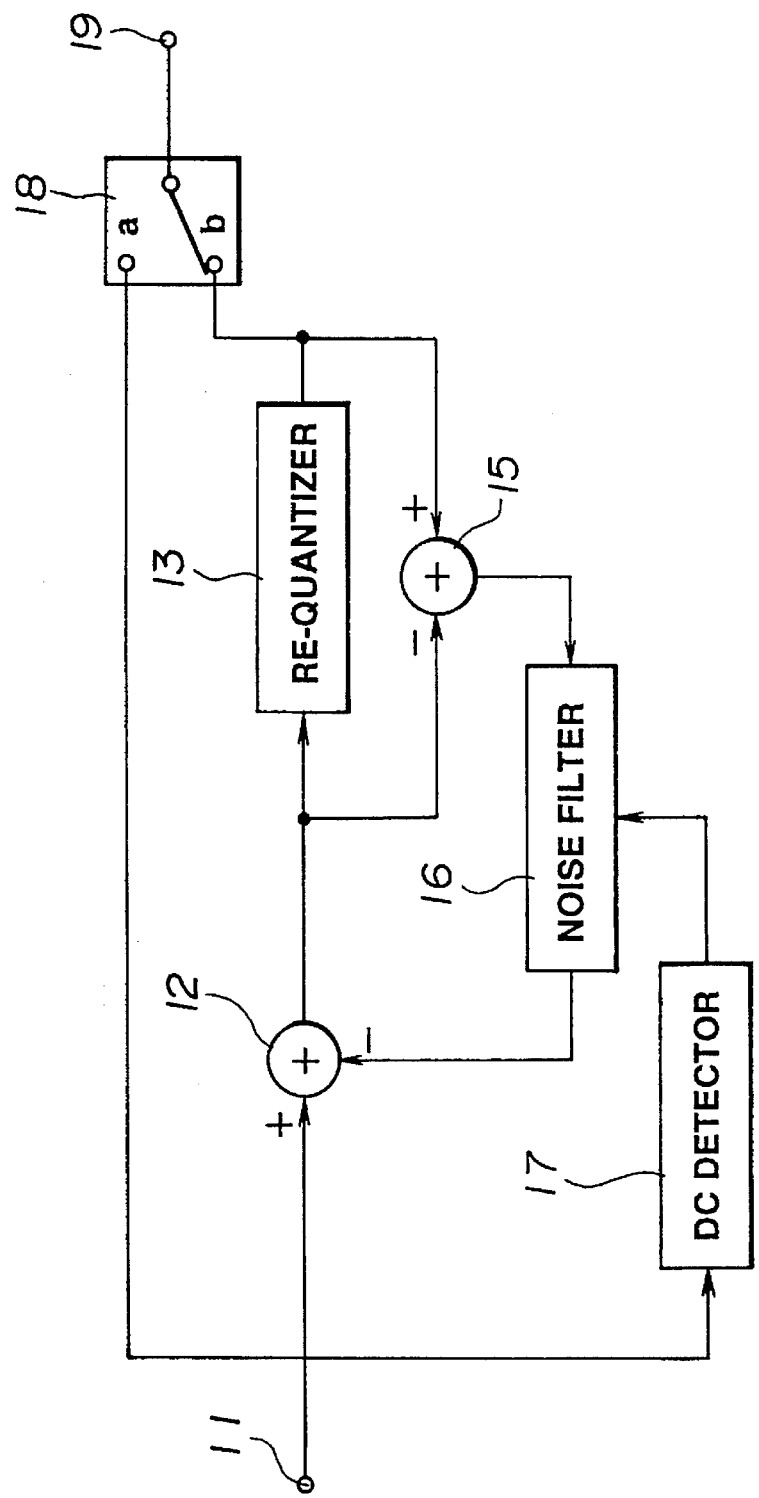
FIG. 5 is a schematic block circuit diagram showing an arrangement of a noise shaping circuit advantageously employed in the processing device shown in FIG. 4.

The noise shaping circuit employed in the Lch processing unit 33 or the Rch processing unit 34 of the sound quality improvement device shown in FIG. 4 preferably includes a changeover switch 18 shown in FIG. 5, in addition to the components shown i n FIG. 1.

That is, in the noise shaping circuit shown in FIG. 5, the input terminal 11 , additive node (subtractive node) 12, requantizer 13, subtractive node 15, noise filter 16 and the dc detector 17 are the same as those shown in FIG. 1. In addition, the changeover switch 18 is provided in the arrangement of FIG. 5. In the changeover switch 18, input signals from the input terminal 11 and quantized output signals of the re-quantizer 13 are supplied to its fixed terminals a and b, respectively, and output signals are issued at an output terminal 19.

The changeover switch 18 is changed over under control of the changeover information signal transmitted from the mode changeover switch 41 shown in FIG. 4. If the mode is for performing the above-described sound quality improvement operation, the changeover switch 18 is set to the side of the fixed terminal b for transmitting the converted 16-bit data from the requantizer 13 to the output terminal 19. If the mode is for directly outputting the input 20-bit data without performing the above-described sound quality improvement operation, the changeover switch 18 is set to the side of the fixed terminal a for transmitting the 20-bit data at the input terminal 11 directly to the output terminal 19.

On the other hand, if the device for improving the sound quality shown in FIG. 4 is to be implemented by the software technique, using the so-called digital signal processor (DSP), the above-mentioned Lch processing unit 33 or the Rch processing unit 34 is implemented by the processing steps shown in the flow chart of FIG. 3. In addition, a step for making a decision as to whether or not the input data is to be passed directly to the output (through-input mode) is provided after the end of the outputting of the quantization errors of step S10 shown in FIG. 3. If the result of that decision is NO, that is if the mode is the sound quality improvement mode, the 16-bit noise-shaped data is issued as output data. If the result of that decision is YES, that is if the mode is the above-mentioned through-input mode, the 20-bit input data is issued directly as output data and subsequently control proceeds to the input data reading step S2 shown in FIG. 3.

Figure 6:
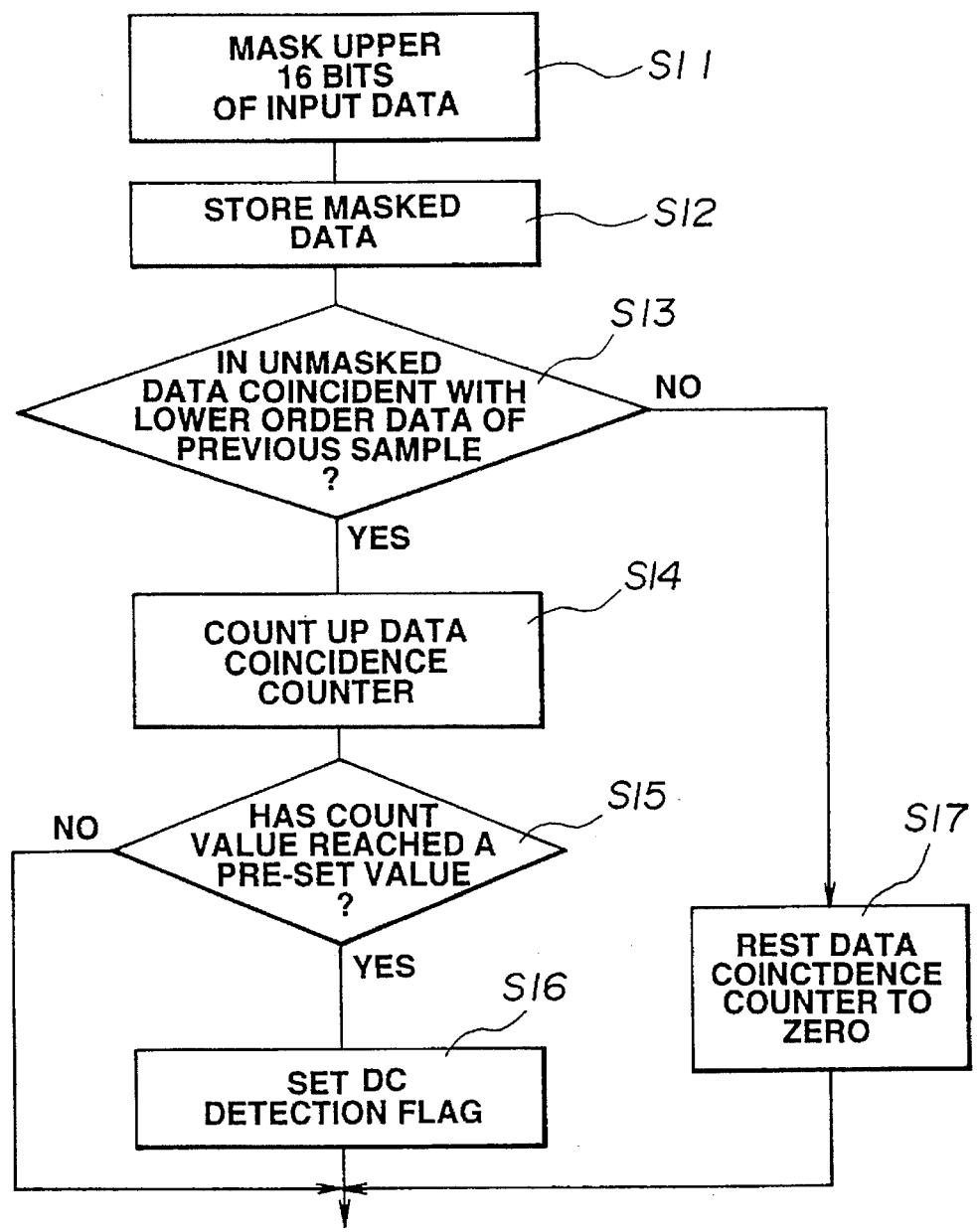
FIG. 6 is a flow chart for illustrating the operation of dc detection of the noise shaping circuit embodying the present invention.
Figure 7:
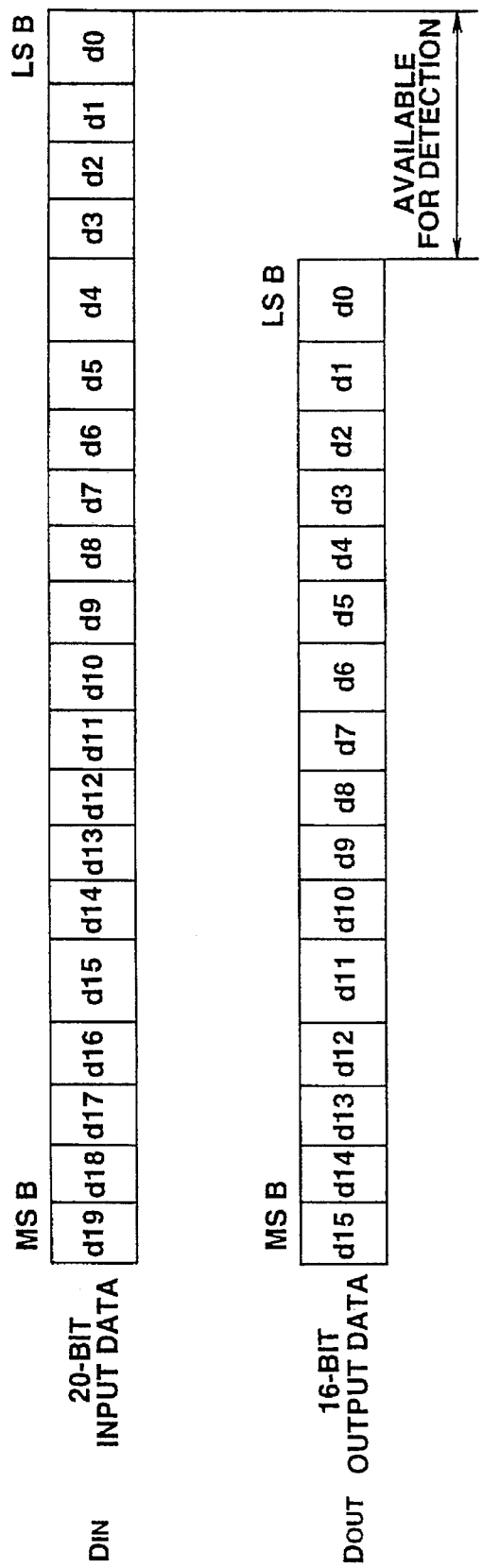
FIG. 7 illustrates input data to and output data from the noise shaping circuit.

Referring to FIG. 6, there is shown a flow chart for implementing the operation of the dc detector 17 of FIG. 5 of the dc detecting operation of the step S3 of FIG. 3 by the software technique. The dc detecting operation is shown in FIG. 7, in which lower four bits (d0, d1, d2, d3) of input 20-bit data $D_{IN}$, corresponding to a difference between the 20-bit input data $D_{IN}$ and 16-bit output data $D_{OUT}$, are monitored and, if the same data have occurred on end over a pre-set number of samples, at least two of more samples, a decision is given that the dc data, inclusive of 0, has been entered.

Referring to FIG. 6, at the first step S11, the upper 16 bits of the input 20-bit data $D_{IN}$ are masked for taking out only the lower four bits (d0, d1, d2, d3) of the input 20-bit data $D_{IN}$ employed for dc detection. The data consisting only of the lower four bits as a result of masking is stored at step S12 in a memory. The lower four bit data of the previous sample, stored in the memory, is read out, and compared at step S13 to the lower four bits of the current sample to make a decision if these two data coincide with each other.

If the result of the decision at step S13 is YES, that is if the two data are found to be coincident with each other, control proceeds to step S14 to count up a data coincidence counter. Control then proceeds to step S15 to decide if the count value of the data coincidence counter has reached a pre-set value. The operation is carried out to decide if the lower four bits of the input data remain constant or unchanged over the pre-set number of samples as a criterium for deciding whether or not the input data is the dc data. If the result of decision at step S15 is YES, control proceeds to step S16 to set a dc detection flag to terminate the dc detecting operation. For example, if the dc detecting routine is a subroutine, control returns to the main routine. If the result of decision at step S15 is NO, control causes the step S16 to be skipped to terminate the dc detecting routine.

If the result of decision at step S13 is NO, that is if the lower four bits of the current sample are not coincident with those of the previous sample, control proceeds to step S17 to reset the data coincidence counter to zero before terminating the dc detecting routine.

Figure 8:
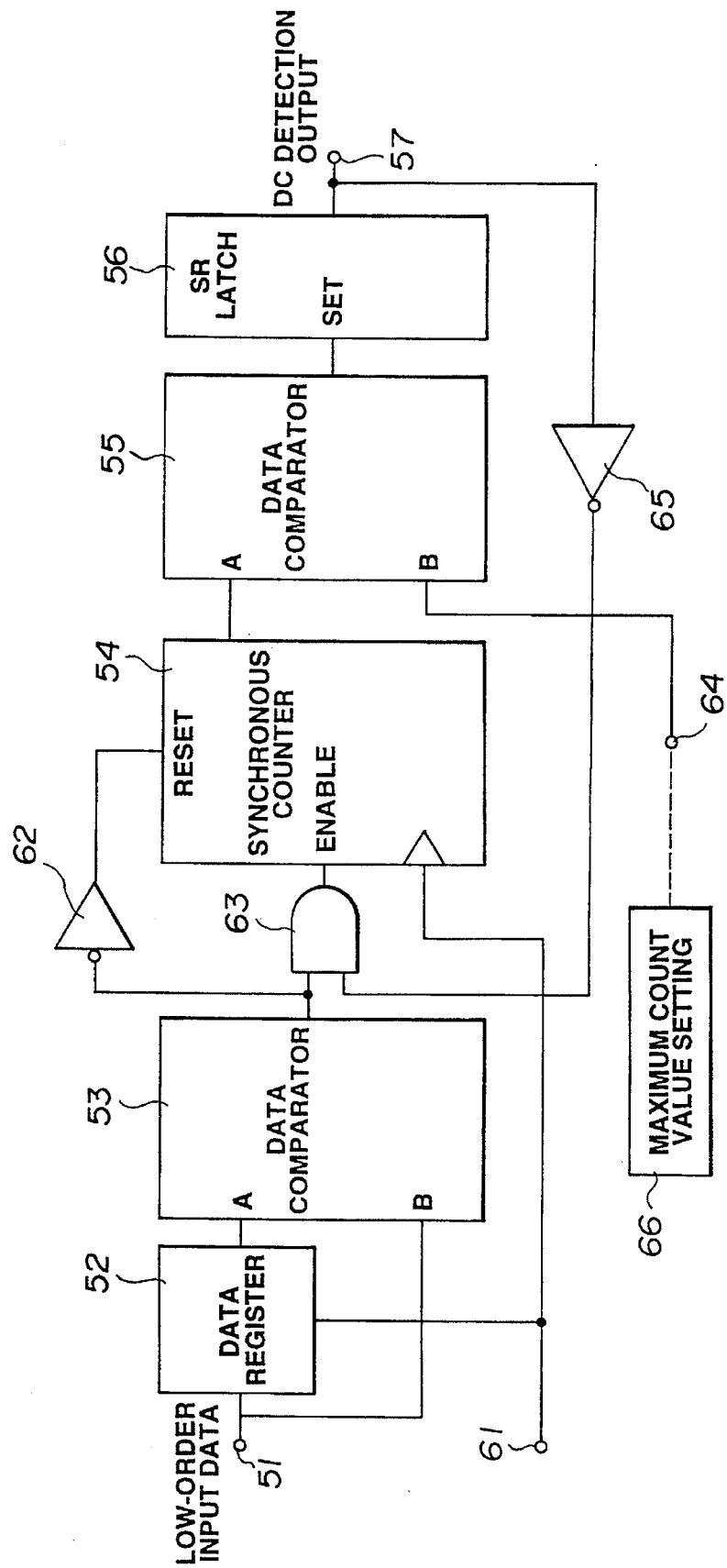
FIG. 8 is a block example of a circuit diagram showing an hardware construction for dc detection by the noise shaping circuit embodying the present invention.

FIG. 8 shows a concrete circuit arrangement for implementing the dc detecting operation by the hardware.

Referring to FIG. 8, the lower four bits (d0, d1, d2, d3) of the 20-bit input data employed for dc detection (lower order data) are supplied to an input terminal 51. The lower order input data are delayed by one sample by a data register 52 and thence supplied to an input terminal A of a data comparator 53, the other input terminal B of which has the lower order data from the input terminal 51 supplied directly, that is without delay. The data comparator 53 compares the lower order data of the current sample to the lower order data of the previous sample. In case of coincidence of the data, a coincidence output is supplied via an AND gate 63 to an enable input of a synchronous counter 54. The coincidence output of the data comparator 53 is also transmitted via an invertor 62 to a reset terminal of the synchronous counter 54.

A count output of the synchronous counter 54 is supplied to one input terminal A of a data comparator 55, the other input B of which has a maximum count value from an input terminal 64 is supplied thereto. When the count output value reaches the maximum count value, a coincidence output is supplied to a set input terminal of a set/reset latch (SR latch) 56. An output of the SR latch 56 is taken out as a dc detection output at an output terminal 57, while being returned to the AND gate 63 via an invertor 63.

The data register 52 and the synchronous counter 54 are operated with a word synchronizing signal from an input terminal 61 as a clock. Thus the synchronous counter 54 counts the word synchronizing clocks from the input terminal 61 only during the time period when the signal to the enable terminal remains high ("H") or logical 1, that is only during the count enable period. The count enable state is established when the data comparator 53 issues a lower order data coincidence output and a dc detection output is not as yet produced by the SR latch 56. The number of words or samples is counted during such count enable state to find the number of consecutive samples having the coincident lower order data. If the lower order data become noncoincident during the count operation so that the output of the data comparator 53 become low or logical 0, the output is inverted by the invertor 61 and the inverted signal is transmitted to the reset terminal of the synchronous counter 54 so that the counter 54 is reset to zero.

If the samples having the coincident lower order data occur consecutively to maintain the counting operation by the synchronous counter 54 until the count value reaches the above-mentioned maximum count value, the SR latch 56 is set by the coincidence output of the data comparator 55 and a dc detection output is issued at the output terminal 57. On the other hand, the dc detection output is inverted by the invertor 65 and thence transmitted to the AND gate 63, the count enable state of the synchronous counter 54 is canceled to discontinue the counting operation to cause the coincidence signals to be outputted continuously from the data comparator 55. The reset signal for the SR latch 56 is the inverted coincidence output of the data comparator 55. That is, by the lower order data becoming noncoincident and the output of the data comparator 53 going low, the synchronous counter 54 is reset by means of the invertor 62, so that its count value is reset to zero and the output of the data comparator 55 goes low to reset the SR latch 56.

The threshold for dc detection may also be controlled as desired by controlling the maximum count value transmitted to the input terminal 64. Specifically, the maximum count value may be controlled by a maximum value setting circuit 66.

It should be noted that, with the above-described noise shaping circuit employing the requantizer for converting the 20-bit data into the 16-bit data, and generally from n-bit data into m-bit data, there is a risk that oscillation data due to the above-mentioned hunting be added to the input data despite the fact that the number of bits of the input data is equal to or less than that of the output data. Consequently, it becomes necessary to detect both if the input data is the dc data including zero and if the input data is the 16-bit data simultaneously.

This may also be realized by monitoring the LSB side four bits as shown in FIG. 7. If assumed that the dc data is entered, and the data has 17 or more bits, the lower order bits being monitored are necessarily changed if the input signals are music signals. If the input signals are dc signals, the data remains at a constant value, so that the lower order bits are not changed. Consequently, the decision as to whether or not the input signals are dc input data may be made by detecting the lower four bits. If it is assumed that the input signals are 16-bit signals, the data of the 17th bits remain unchanged even if the input signals are music signals, so that, by monitoring the lower order bits, the 16-bit input signals can be discerned from input signals having 17 or more bits as in the case of the inputting of the dc data.

It may be seen the above that the above-described arrangement may be employed both if the input signals are 20-bit dc data and if the input signals are 16-bit signals. Although the foregoing description has been made of the 20-bit input signals, the digital audio interface may be adapted for coping with up to 24-bit data, in which case it suffices to monitor the lower eight bits of the 24-bit input signals. In general, in converting the n-bit input signals into m-bit data, it suffices to monitor the lower (n - m) bits of the input data.

It is to be noted that the present invention is not limited to the above-described illustrative embodiments. For example, if it is detected that the above-described hunting is likely to occur, the feedback quantity may be reduced to zero by opening a switch connected between the noise filter and the additive node (subtractive node) at the requantizer input.

What is claimed is:

1. A noise shaping circuit for use in transmitting a digital input signal in which quantization noise generated by a quantizer is fed back as a feedback signal via a noise filter to an input side of said quantizer comprising:

means for detecting whether the digital input signal has a dc value including zero and, means for setting the feedback signal to zero when the dc value is detected by the means for detecting.

2. The noise shaping circuit as claimed in claim 1 wherein said means for setting includes means for setting multiplier coefficients of the noise filter to zero.

3. The noise shaping circuit as claimed in claims 1 or 2 wherein said means for detecting includes means for determining that a pre-set number of consecutive samples of said input signals assume a constant value.

4. A noise shaping circuit for use in transmitting a digital signal in which quantization noise generated by a quantizer is fed back as a feedback signal via a noise filter to an input side of said quantizer comprising:

detection means for detecting that lower order bits of a pre-set number of consecutive samples of an input digital signal remain constant, and means for setting the feedback signal to zero when the lower order bits are detected to be constant.

5. A method of transmitting digital signals employing noise shaping in which quantization noise generated by a quantizer is fed back as a feedback signal via a noise filter to an input side of said quantizer comprising the steps of:

detecting whether input digital signal are of a dc value including zero, and reducing a level of the feedback signal fed to the quantizer to zero if the dc value is detected in the detecting step.

6. The method of transmitting digital signals employing noise shaping as claimed in claim 5 wherein the step of reducing the level of the feedback signal when the dc input is detected by the dc detecting step, includes the step of setting the coefficients of the noise filter to zero.

7. The method of transmitting digital signals employing noise shaping as claimed in claims 5 or 6 in which the step of detecting includes detecting whether a pre-set number of consecutive samples of the input digital signals are of a constant value.

8. A method of transmitting digital signals, comprising the steps of:

receiving an digital input audio signal;

subtracting an error feedback signal from said input audio signal to produce a main signal;

quantizing said main signal to produce a quantized main signal;

generating a difference signal by subtracting said main signal from said quantized main signal;

filtering said difference signal to produce said error feedback signal;

detecting whether said digital input audio signal has a constant value over a predetermined number of samples;

reducing said error feedback to zero when said constant value is detected; and transmitting said quantized main signal.

9. The method of transmitting according to claim 8, wherein said step of detecting uses four least significant bits in detecting the constant value.

10. The method of transmitting according to claim 8, wherein said step of detecting uses eight least significant bits in detecting a constant value.

11. The method of transmitting according to claim 8, wherein said step of detecting a constant value includes detecting a zero value.

12. The method of transmitting according to claim 8, wherein said step of reducing said error feedback to zero includes inserting a plurality of zero coefficient multipliers in said step of filtering so as to produce zero level outputs forming said error feedback signal.

13. The method of transmitting according to claim 12 wherein said step of inserting includes switching said difference signal from non-zero coefficient multipliers to said zero coefficient multipliers in response to said digital input audio signal having a constant value.

14. The method of transmitting according to claim 8, further comprising the step of selectively supplying said digital input audio signal in said step of transmitting in substitution for said quantized main signal.

15. The method transmitting according to claim 8, wherein said step of detecting includes masking a predetermined number of upper bits in said digital input audio signal and determining said constant value using the remaining unmasked bits.

16. Apparatus for transmitting digital signals comprising:

means for receiving an input digital audio signal;

means for subtracting a noise feedback signal from said input signal to produce a main signal;

means for quantizing said main signal to produce a quantized output signal;

means for generating a noise signal by subtracting said main signal from said quantized output signal;

a digital filter including a plurality of coefficients for receiving said noise signal and producing said noise feedback signal; and means for detecting whether said input digital audio signal has a constant value over a predetermined number of samples thereof and producing a control signal indicating a result of said detecting, said control signal being fed to said digital filter for setting said plurality of coefficients to zero upon detecting said constant value.

17. The apparatus according to claim 16, further comprising switch means having inputs connected to said input digital audio signal and said quantized output signal for selectively connecting one of said inputs to an output terminal for transmission.

* * * * *